(12) United States Patent
Ichikawa et al.

(10) Patent No.: US 10,680,377 B2
(45) Date of Patent: Jun. 9, 2020

(54) HOUSING STRUCTURE OF PRINTED CIRCUIT BOARD WITH CONNECTOR

(71) Applicant: AISIN SEIKI KABUSHIKI KAISHA, Kariya-shi, Aichi-ken (JP)

(72) Inventors: Junya Ichikawa, Nishio (JP); Hidetoshi Yata, Ichinomiya (JP); Takashi Miyakawa, Chiryu (JP)

(73) Assignee: AISIN SEIKI KABUSHIKI KAISHA, Kariya-shi, Aichi-ken (JP)

( * ) Notice: Subject to any disclaimer, the term of this patent is extended or adjusted under 35 U.S.C. 154(b) by 0 days.

(21) Appl. No.: 16/394,654

(22) Filed: Apr. 25, 2019

(65) Prior Publication Data
US 2019/0334276 A1 Oct. 31, 2019

(30) Foreign Application Priority Data

Apr. 27, 2018 (JP) ................................ 2018-086764

(51) Int. Cl.
| | | |
|---|---|---|
| *H01R 13/46* | (2006.01) | |
| *H05K 5/00* | (2006.01) | |
| *H01R 12/72* | (2011.01) | |

(52) U.S. Cl.
CPC .......... *H01R 13/46* (2013.01); *H01R 12/721* (2013.01); *H05K 5/0026* (2013.01)

(58) Field of Classification Search
CPC .. H05K 5/0069; H05K 5/0026; H05K 5/0004; H01R 13/502; H01R 13/506; H01R 13/508; H01R 13/46; H01R 12/721
See application file for complete search history.

(56) References Cited

U.S. PATENT DOCUMENTS

| | | | | | |
|---|---|---|---|---|---|
| 5,414,597 | A | * | 5/1995 | Lindland | H05K 9/0037 174/361 |
| 5,703,754 | A | * | 12/1997 | Hinze | B60R 16/0239 174/562 |
| 6,394,844 | B1 | * | 5/2002 | Frias Valero | H01R 13/516 439/607.07 |
| 6,428,330 | B1 | * | 8/2002 | Poulter | H04L 12/4604 439/607.23 |
| 6,977,822 | B2 | * | 12/2005 | Otani | H05K 9/0016 174/359 |
| 7,080,990 | B1 | * | 7/2006 | Juntwait | H01R 12/724 439/79 |

(Continued)

FOREIGN PATENT DOCUMENTS

| | | |
|---|---|---|
| JP | 11-284375 A | 10/1999 |
| JP | 2012-230994 A | 11/2012 |

*Primary Examiner* — Briggitte R. Hammond
(74) *Attorney, Agent, or Firm* — Sughrue Mion, PLLC

(57) ABSTRACT

A housing structure of a printed circuit board with a connector includes the printed circuit board on which an electronic component is implemented, the connector implemented on an end portion of the printed circuit board, the connector including a fitted portion fitted with a mating component which is a connection target, and a housing accommodating the printed circuit board and the connector. The housing includes a first case surrounding the printed circuit board and a second case covering the connector. The second case includes a first surface portion arranged at a side where the fitted portion of the connector is provided, and at least one second surface portion which is nonparallel to the first surface portion.

2 Claims, 2 Drawing Sheets

(56) References Cited

U.S. PATENT DOCUMENTS

| | | | |
|---|---|---|---|
| 7,094,075 B1* | 8/2006 | Lim | H01R 13/508 |
| | | | 439/76.1 |
| 7,616,448 B2* | 11/2009 | Degenkolb | H05K 3/284 |
| | | | 174/50.5 |
| 7,697,300 B2* | 4/2010 | Brandt | B60R 16/0239 |
| | | | 361/704 |
| 7,699,622 B2* | 4/2010 | Sakamoto | H01R 13/629 |
| | | | 439/76.1 |
| 8,011,952 B1* | 9/2011 | Zhong | H01R 13/506 |
| | | | 439/540.1 |
| 8,523,581 B2* | 9/2013 | Martin | H01R 12/724 |
| | | | 439/83 |
| 8,727,794 B2 | 5/2014 | Tanaka et al. | |
| 8,770,989 B2* | 7/2014 | Ohhashi | H05K 5/0069 |
| | | | 439/589 |
| 8,830,686 B2* | 9/2014 | Nomoto | H05K 5/0078 |
| | | | 361/752 |
| 9,093,776 B2* | 7/2015 | Yamanaka | H05K 5/0069 |
| 9,472,906 B2* | 10/2016 | Humburg | H01R 13/502 |
| 9,578,761 B2* | 2/2017 | Chitaka | H05K 5/00 |
| 9,688,228 B2* | 6/2017 | Azuma | B60R 21/01 |
| 10,111,347 B2* | 10/2018 | Jorgensen | H05K 5/0039 |
| 10,251,297 B2* | 4/2019 | Manushi | H05K 1/181 |
| 10,349,537 B1* | 7/2019 | Federizo | H05K 3/341 |
| 2005/0020104 A1* | 1/2005 | Yamamoto | H01R 13/4361 |
| | | | 439/76.1 |
| 2012/0094508 A1* | 4/2012 | Tao | H01R 27/02 |
| | | | 439/76.1 |
| 2016/0254612 A1* | 9/2016 | Andrei | H01R 13/5202 |
| | | | 439/701 |

\* cited by examiner

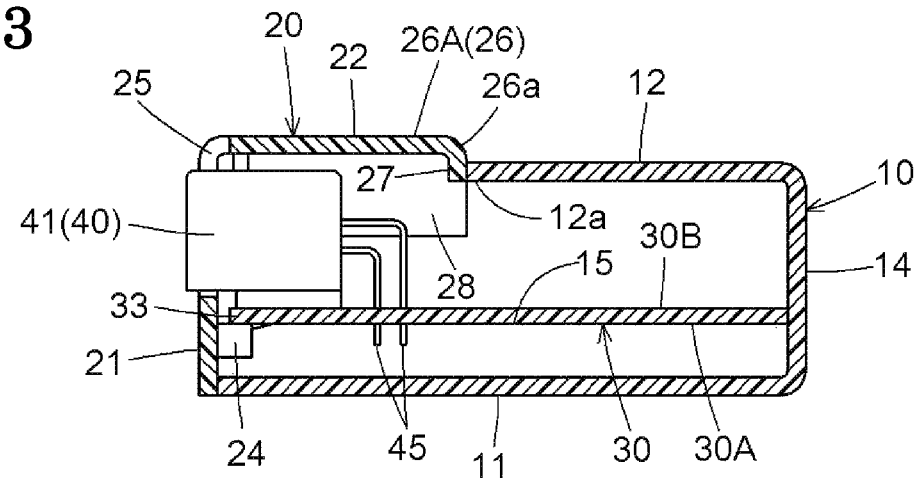
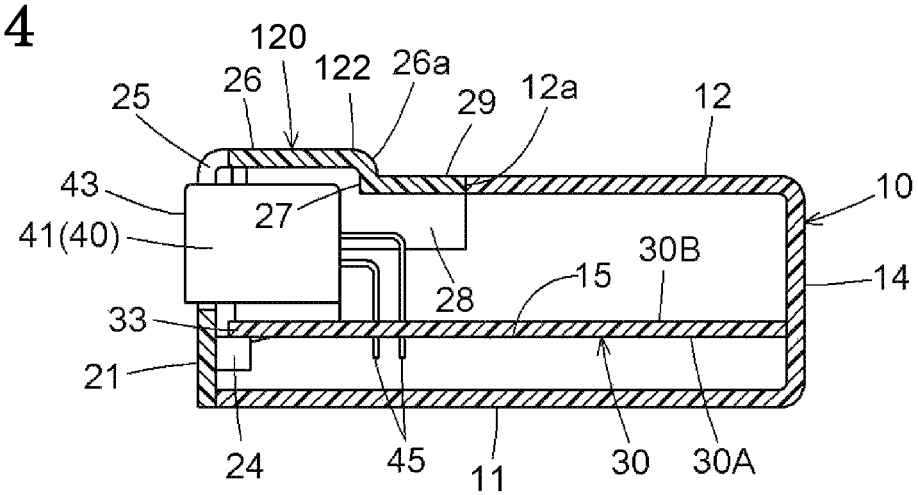
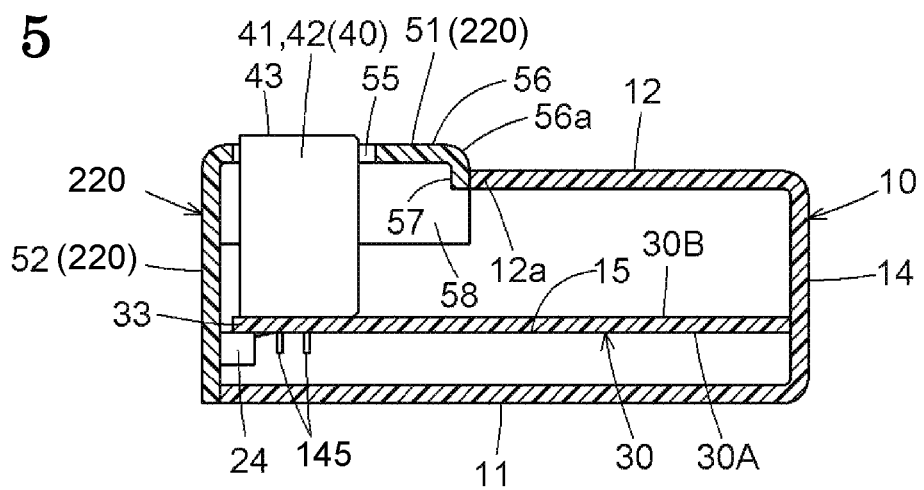

HOUSING STRUCTURE OF PRINTED CIRCUIT BOARD WITH CONNECTOR

CROSS REFERENCE TO RELATED APPLICATIONS

This application is based on and claims priority under 35 U.S.C. § 119 to Japanese Patent Application 2018-086764, filed on Apr. 27, 2018, the entire content of which is incorporated herein by reference.

TECHNICAL FIELD

This disclosure generally relates to a housing structure of a printed circuit board with a connector.

BACKGROUND DISCUSSION

A known housing structure of an electronic control device including a rectangular-parallelepiped housing, a printed circuit board accommodated in the housing, and a cover attached on an opening of the housing is disclosed in JPH11-284375A (hereinafter referred to as Patent reference 1). A connector connected to an electric circuit element implemented on the printed circuit board is arranged at an end portion of the printed circuit board. The connector includes a fitted portion fitted with a mating component which is a connection target. The cover is provided so as to cover surroundings of the fitted portion of the connector relative to the opening of the housing.

JP2012-230994A (hereinafter referred to as Patent reference 2) discloses an electronic control device including a printed circuit board, a connector implemented on an end portion of the printed circuit board, and a housing accommodating the printed circuit board and including an opening portion at a position where the connector is arranged. A surface portion of the housing opposed to an upper surface of the printed circuit board is configured such that is a part opposed to the printed circuit board and the connector is further away from the printed circuit board relative to a part opposed only to the printed circuit board.

According to the electronic control device in Patent reference 1, because the housing accommodating the printed circuit board is formed in the rectangular-parallelepiped shape in accordance with the height of the connector, the dimension of the electronic control device is increased. Thus, for example, it may be difficult for the electronic control device disclosed in Patent reference 1 to be mounted on a small space of, for example, a vehicle. Meanwhile, according to the electronic control device disclosed in Patent reference 2, the housing accommodating the printed circuit board may include a low height at other than the part opposed to the connector, and thus, the device itself may be minimized. However, the connector implemented on the printed circuit board may include height which is different depending on types of electronic control devices, and thus, according to Patent reference 2, a dedicated housing may be required in accordance with the connector.

A need thus exists for a housing structure of a printed circuit board with a connector which is not susceptible to the drawback mentioned above.

SUMMARY

According to an aspect of this disclosure, a housing structure of a printed circuit board with a connector includes the printed circuit board on which an electronic component is implemented, the connector implemented on an end portion of the printed circuit board, the connector including a fitted portion fitted with a mating component which is a connection target, and a housing accommodating the printed circuit board and the connector. The housing includes a first case surrounding the printed circuit board and a second case covering the connector. The second case includes a first surface portion arranged at a side where the fitted portion of the connector is provided, and at least one second surface portion which is nonparallel to the first surface portion.

BRIEF DESCRIPTION OF THE DRAWINGS

The foregoing and additional features and characteristics of this disclosure will become more apparent from the following detailed description considered with the reference to the accompanying drawings, wherein:

FIG. 3 is a cross sectional view of the housing structure according to the first embodiment;

FIG. 4 is a cross sectional view of a housing structure according to a modified example of the first embodiment; and FIG. 5 is a cross sectional view of a housing structure according to a second embodiment.

DETAILED DESCRIPTION

Figure 1:
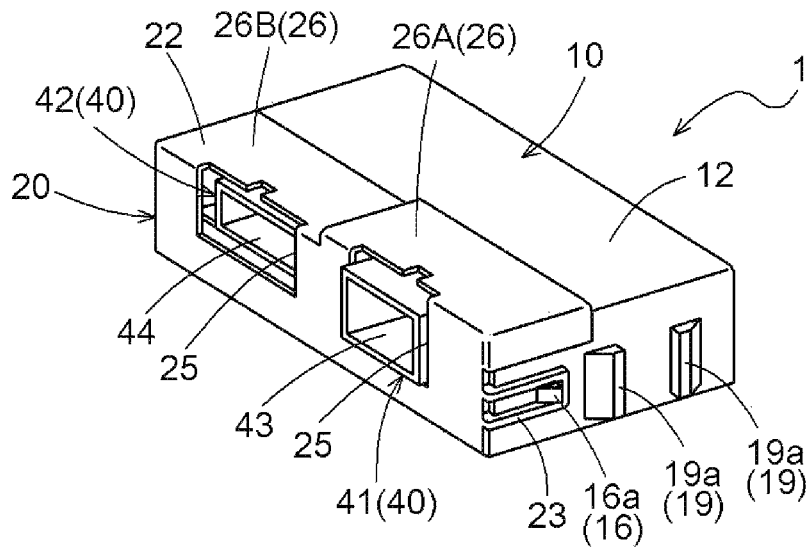
FIG. 1 is a perspective view illustrating a housing structure according to a first embodiment disclosed here.
Figure 2:
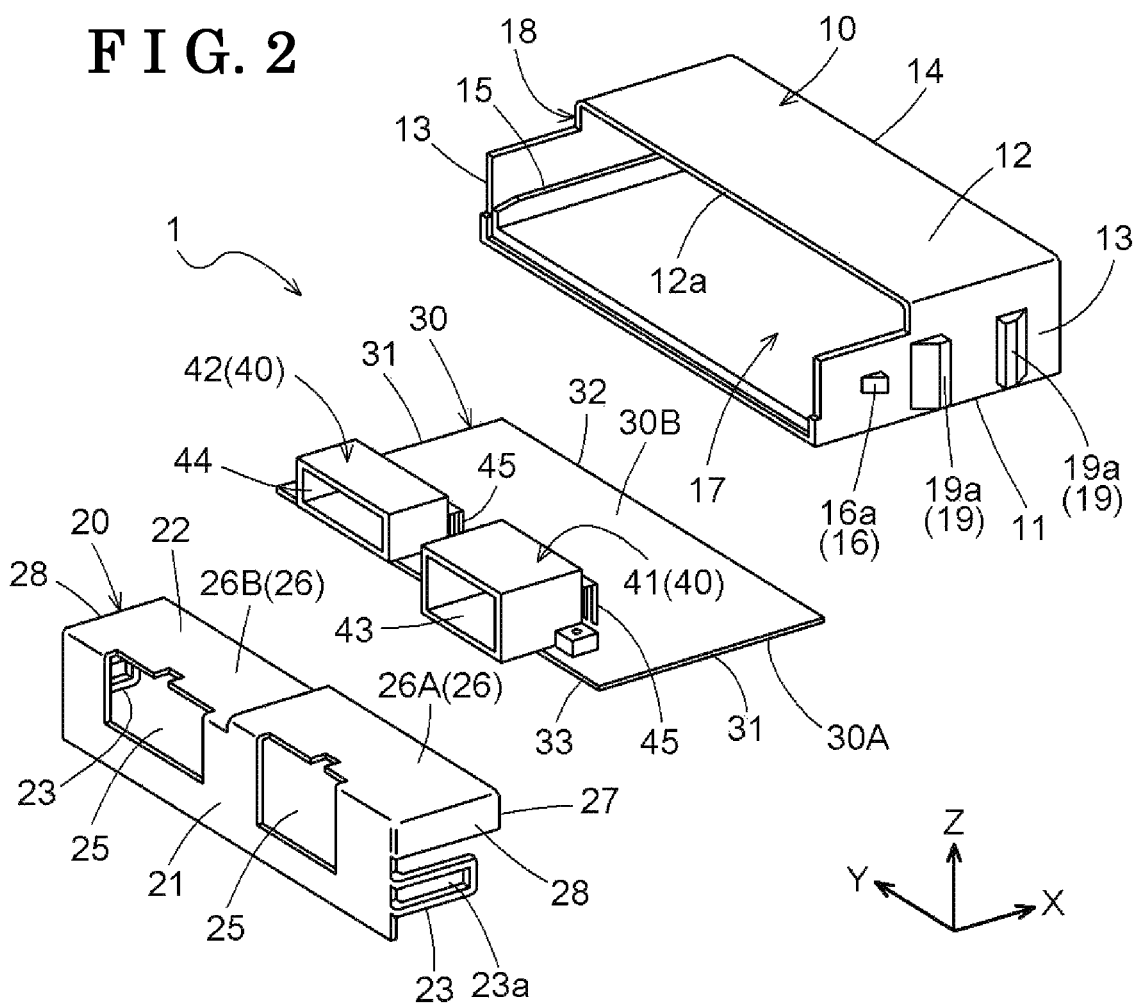
FIG. 2 is an exploded perspective view of the housing structure according to the first embodiment.

A housing structure of a printed circuit board with a connector according to a first embodiment will be illustrated in FIGS. 1 to 3. As illustrated in FIGS. 1 to 3, a housing 1 houses a printed circuit board 30 including an electronic control unit or an ECU mounted on, for example, an engine for an automobile, and a connector 40. The housing 1 includes a first case 10 surrounding the printed circuit board 30 and a second case 20 covering the connector 40. The housing 1 is made from a resin material which is made of, for example, polybutylene terephthalate or PBT, or polypropylene or PP, and is molded by being injected within a cavity of a mold (injection molding). Hereinafter, as shown in FIG. 2, a depth direction of the housing 1 corresponds to a X direction (an insertion direction of the printed circuit board 30), a width direction of the housing 1 corresponds to a Y direction, and a height direction of the housing 1 corresponds to a Z direction.

Electronic components are implemented on the printed circuit board 30, and as illustrated in FIG. 2, the connector 40 is implemented on an end portion of the printed circuit board 30. According to the first embodiment, two connectors, a first connector 41 and a second connector 42, are implemented along the width direction (Y direction) of an upper surface 30B of the printed circuit board 30. The first and second connector 41, 42 are provided with first and second fitted portions 43, 44 fitted with mating components which are connection targets, respectively. The first and second fitted portions 43, 44 of the first and second connector 41, 42 are oriented such that the mating components which are connection targets to the first and second fitted portions 43, 44 are fitted to the printed circuit board 30 in a parallel manner. The first and second connector 41, 42 each includes a connection terminal 45, a first end thereof is implemented on the printed circuit board 30 by soldering by being bent in a right angle direction or a substantially right angle direction, and a second end of the connection terminal 45 is exposed from each of the first and second fitted portions 43, 44 of the first and second connector 41, 42. The first and second connector 41, 42 each shall require high package height, and other electronic components each shall require package height lower than the first and second connectors 41, 42.

As illustrated in FIG. 2, the first case 10 includes a top plate portion 12, a bottom plate portion 11, first side wall portions 13, 13, and a second side wall portion 14. The top plate portion 12 covers the upper surface 30B of the printed circuit board 30. The bottom plate portion 11 covers a lower surface 30A of the printed circuit board 30 which is arranged in parallel to and opposite to the upper surface 30B of the printed circuit board 30. The first side wall portions 13, 13 cover right and left side surfaces 31, 31 which serve as surfaces arranged at opposing ends of the printed circuit board 30 in the Y direction, the surfaces among surfaces orthogonal to the lower surface 30A and the upper surface 30B of the printed circuit board 30. The second side wall portion 14 covers the side surface 32 of the printed circuit board 30 arranged at a front end thereof in the insertion direction. The first side wall portions 13, 13 and the second side wall portion 14 are standingly provided from the bottom plate portion 11. The top plate portion 12 covers parts of the upper surface 30B of the printed circuit board 30 where the first and second connector 41, 42 are not implemented (parts of the side where the side surface 32 is arranged).

Guide rails 15 guiding the printed circuit board 30 when the printed circuit board 30 is inserted into the first case 10 are arranged at inner surfaces of the first side wall portions 13, 13 and extend along the X direction. Engaged protrusions 16 (an example of an engaged portion) for fixing the second case 20 to the first case 10 are provided at outer surfaces of the first side wall portions 13, 13, respectively. The engaged protrusion 16 corresponds to a plate-shaped small piece engageable with a hook portion 23 of the second case 20, and includes a tapered surface 16a inclined or tilted toward a rear end of the printed circuit board 30 in the insertion direction (the X direction). The first side wall portions 13, 13 each is provided with stay a holding portion 19 for holding a stay at the front end of the printed circuit board 30 in the insertion direction relative to the engaged protrusion 16. The stay holding portion 19 includes two support portions 19a, 19a extending in the upper-lower direction, the two support portions 19a, 19a into which the stay is inserted to be retained.

The first case 10 includes an opening portion 17 opening at a position opposed to a side surface 33 of the printed circuit board 30 in the insertion direction, the side surface 33 arranged at the rear end of the printed circuit board 30. The first case 10 further includes a cutout portion 18 which opens an upper side and the sides of the first and second connector 41, 42. The cutout portion 18 extends from parts of the top plate portion 12 opposed to the first and second connector 41, 42 to upper portions of the first side wall portions 13, 13.

The second case 20 includes a first surface portion 21 surrounding the side where the first and second fitted portions 43, 44 of the first and second connectors 41, 42 are provided, and second surface portions 22 which are continuously provided from an end portion of the first surface portion 21 and which are orthogonal (nonparallel) thereto. The first surface portion 21 includes a shape corresponding to the opening portion 17 of the first case 10. The second surface portions 22 include a flat surface portion 26, an extending portion 27, and side surface portions 28, 28. The flat surface portion 26 is parallel to the lower surface 30A and the upper surface 30B of the printed circuit board 30.

The extending portion 27 is continuously provided from an end portion 26a of the flat surface portion 26, the end portion 26a arranged close to the first case 10, and extends toward the printed circuit board 30. The side surface portions 28, 28 are continuously provided from opposing ends of the flat portions 26 in the Y direction and extend toward the first side wall portions 13, 13. Therefore, the shape of the second surface portion 22 corresponds to the cutout portion 18. That is, the second surface portion 22 of the second case 20 includes the flat surface portion 26 which is nonparallel to the first surface portion 21, the extending portion 27, and the side portions 28, 28. As such, because the second case 20 includes the first surface portion 21 and at least one of the second surface portions 22 that are nonparallel to the first surface portion 21, the second case 20 of the housing 1 may include a shape which is applicable to the first and second connector 41, 42.

Meanwhile, since the first case 10 only covers electronic components that include lower height than those of the first and second connectors 41, 42, the height of the first case 10 (a distance between the bottom plate portion 11 and the top plate portion 12) may be decreased, and the first case 10 may be minimized in size. Accordingly, the whole housing 1 of the printed circuit board 30 with the connector 40 may be minimized. According to the housing 1 of the printed circuit board 30 with the connector 40, the first case 10 may be commonly provided or standardized, and the second case 20 may be appropriately selected, the second case 20 applicable to plural kinds of connectors 40 having different shapes.

The first surface portion 21 is provided with quadrilateral openings 25, 25 surrounding the first and second fitted portions 43, 44 of the first and second connector 41, 42, respectively. The first fitted portion 43 of the first and second fitted portions 43, 44 of the first and second connectors 41, 42 extends outwardly from the opening 25 of the first surface portion 21. Accordingly, the first fitted portion 43 of the first connector 41 may be easily fitted with the mating component which is a connection target.

The first surface portion 21 is provided with U-shaped hook portions 23 and support protrusions 24. The hook portions 23 extend along the X direction from light and left ends of the first surface portion 21 in the width direction (Y direction). The support protrusions 24 are arranged at lower center portions of inner surface sides (the opposing sides of the side surfaces 33 of the printed circuit board 30) and extend along the Y direction. The hook portion 23 of the first surface portion 21 and the engagement protrusion 16 provided at the first side wall portion 13 of the first case 10 constitute a snap fit portion. The hook portions 23, 23 each includes a through hole 23a between the hook portion 23 and the first surface portion 21. The second case 20 is fixed to the first case 10 by fitting of the engagement protrusion 16 into the through hole 23a. The housing 1 may be easily configured by the first case 10 and the second case 20 that are assembled with each other by the snap fit portion. Because the support protrusions 24 support a center portion of the rear end side of the bottom surface 30A provided at the printed circuit board 30 in the insertion direction, the printed circuit board 30 is inhibited from being deformed, curved or warped by aged deterioration.

The flat surface portion 26 of the second surface portions 22 of the second case 20 is oriented upwardly of the first and second connectors 41, 42 and opposed to the printed circuit board 30 in a parallel manner. The flat surface portion 26 is away from the printed circuit board 30 relative to the top plate portion 12 of the first case 10, the top plate portion 12 which is arranged at a side where the flat surface portion 26 is provided relative to the printed circuit board 30 and which is opposed to the printed circuit board 30. This is because the first and second connectors 41, 42 among the components implemented in the printed circuit board 30 when being implemented include height higher than other types of electronic components. Accordingly, according to the height direction (the Z direction) of the casing 1, the distance between the top plate portion 12 of the first case 10 and the printed circuit board 30 in the height direction (the Z direction) may be decreased and the distance between the second surface portions 22 of the second case 20 and the printed circuit board 30 may be increased. As a result, the outer shape of the housing 1 of the printed circuit board 30 with the connector 40 may be reduced.

As illustrated in FIGS. 1 to 3, according to the first embodiment, the flat surface portion 26 is arranged at a position slightly higher than the height of the connector 40, and is formed to match the height of the connector 40. That is, a first part 26A covering the upper surface of the first connector 41 which is higher than the second connector 42 is arranged at a position away from the printed circuit board 30 relative to a second part 26B covering the upper surface of the second connector 42 which is lower than the first connector 41. Accordingly, the first surface portion 21 surrounds three surfaces (three sides) except for an upper surface of the first fitted portion 43 of the first connector 41, and an upper surface of the second fitted portion 44 of the second connector 42. Alternatively, the flat surface portion 26 may be formed such that the first part 26A and the second part 26B are flush with each other. In this case, the second fitted portion 44 of the second connector 42 including lower height shall be configured such that the four surfaces (the four sides) including the upper surface (the upper side) are surrounded by the first surface portion 21.

As illustrated in FIG. 3, the extending portion 27 extends perpendicularly to the flat surface portion 26 towards the printed circuit board 30, and is in contact with an end portion 12a of the top plate portion 12. As such, because the second surface portions 22 of the second case 20 each includes the extending portion 27 provided at a side where the first case 10 is provided and extending toward the printed circuit board 30, the height of the end portion of the second surface portions 22 of the second case 20 may be matched with the height of the end portion 12a of the top plate portion 12 of the first case 10 by appropriate adjustment of the extending direction and the extending length of the extending portion 27. Accordingly, the end portion 12a of the first case 10 and the end portion of the second surface portion 22 of the second case 20 may be easily positioned relative to each other, and may be easily come in contact with each other.

An assembly process of the housing 1 of the first embodiment will hereunder be explained. The printed circuit board 30 implemented with the electronic components and the connector 40 is inserted from the distal end of the printed circuit board 30 into the first case 10 along the guide rails 15 which are arranged inside the first case 10.

Next, the second case 20 is arranged to cover the opening portion 17 and the cutout portion 18 of the first case 10. Here, the support protrusions 24 of the second case 20 come in contact with the lower surface 30A of the printed circuit board 30. Then, the hook portions 23, 23 formed in the U-shape and provided at the opposing sides of the second case 20 climb on the tapered surfaces 16a, 16a relative to the engagement protrusions 16, 16 provided at opposing side surfaces (the first side wall portions 13, 13) of the first case 10, respectively. The engagement protrusions 16, 16 are fitted into the through holes 23a, 23a, respectively. Accordingly, the second case 20 is fixed to the first case 10.

A modified example of the first embodiment will hereunder be explained. FIG. 4 illustrates the modified example of the first embodiment. Because the modified example of the first embodiment includes the same configuration with the first embodiment other than the shape of the second case 20, the same components as those described in the first embodiment are marked with the same reference numerals, and description of the components will not be repeated. A second surface portion 122 of a second case 120 of the modified example includes a second flat surface portion 29 in addition to the first flat surface portion 26, the extending portion 27, and the side surface portions 28, 28. The second flat surface portion 29 is provided from the extending portion 27 toward the top plate portion 12 of the first case 10, and is oriented to be opposed to the printed circuit board 30 in a parallel manner. The second flat surface portion 29 is in contact with the end portion 12a of the top plate portion 12 of the first case 10. In the modified example, the first case 10 is configured as same as that of the first embodiment. As such, the flat surface portion 26 includes the length which is decreased in the X direction and the second flat surface portion 29 which is short in distance from the printed circuit board 30 is provided. Accordingly, the outer shape of the housing 1 of the printed circuit board 30 with the connector 40 may be further minimized.

In the first embodiment, the extending position 27 extends perpendicularly to the printed circuit board 30 from the end portion 26a of the first flat surface portion 26. The extending direction of the extending portion 27 is not limited to a vertical direction. For example, the extending portion 27 may extend obliquely downward toward the printed circuit board 30 from the end portion 26a of the first flat surface portion 26.

Hereinafter, a second embodiment will be explained. FIG. 5 shows a housing structure of the second embodiment. Because the second embodiment includes the same configuration with the first embodiment other than the orientations of the first and second fitted portions 43, 44 of the first and second connector 41, 42 implemented on the printed circuit board 30, the same components as those described in the first embodiment are marked with the same reference numerals, and description of the components will not be repeated. In the second embodiment, the first and second connector 41, 42 each is connected to the printed circuit board 30 with a connection terminal 145 which is a straight type. The first and second fitted portions 43, 44 are provided at the same side where the top plate portion 12 of the first case 10 is arranged. That is, in the second embodiment, the first case 10 of the second embodiment is the same as that of the first embodiment, and only the shape of the second case 20 is different.

As illustrated in FIG. 5, a second case 220 is arranged at a position opposed to the upper surface 30B of the printed circuit board 30, and a second surface portion 52 is arranged at a position opposed to the side surface 33 of the printed circuit board 30 which is at the rear end in the insertion direction. A first surface portion 51 includes a flat surface portion 56, an extending portion 57, and side surface portions 58, 58. The flat surface portion 56 is opposed to the printed circuit board 30. The extending portion 57 extends from an end portion 56a of the flat surface portion 56 toward the printed circuit board 30. The side surface portions 58, 58 extend from opposing ends of the flat surface portion 56 in the Y direction towards the first side wall portions 13, 13. The extending portion 57 is in contact with the end portion 12a of the top plate portion 12 of the first case 10. The flat surface portion 56 is provided with openings 55, 55 surrounding the first and second fitted portions 43, 44 of the first and second connectors 41, 42, respectively. The openings 55, 55 each includes a dimension in which the connector 40 is not in contact with the first surface portion 51.

Other embodiments will hereunder be explained. According to the aforementioned first and second embodiment, the first and second connectors 41, 42 are implemented on the printed circuit board 30. Alternatively, the single connector 40 or the three or more connectors 40 may be implemented on the printed circuit board 30. The first and second connectors 41, 42 may include the single opening 25.

In the second embodiment, the second case 220 is configured such that the first surface portion 51 arranged at the side where the first and second fitted portions 43, 44 of the first and second connector 41, 42 are provided includes the surface portion 56 and the extending portion 57. Alternatively, the first surface portion 51 may be configured such that, similarly to the second flat surface portion 29 provided from the extending portion 27 toward the top plate portion 12 of the first case 10 of the modified example of the first embodiment in FIG. 4, a second flat surface portion may be extendingly provided.

In the aforementioned first and second embodiments, only the first fitted portion 43 of the first connector 41 among the first and second connectors 41, 42 extends outwardly from the opening 25 of the first surface portion 21. Alternatively, the second fitted portion 44 of the second connector 42 may protrude upwardly from the opening 25 of the first surface portion 21. The first and second fitted portions 43, 44 may protrude from the opening 25 of the first surface portion 21. Furthermore, the first and second fitted portions 43, 44 may not protrude from the opening 25 of the first surface portion 21.

In the first and second embodiments, the snap fit portion is provided such that the engaging protrusion 16 is provided at the first case 10 as the engaged portion, and the hook portion 23 engaging the engaging protrusion 16 to the second case 20 is provided. Alternatively, the snap fit portion may be provided such that the engaging protrusion is provided at the second case 20, and the hook portion 23 is provided at the first case 10.

Industrial applicability will hereunder be explained. This disclosure is applicable to any kinds of housing structures of printed circuit boards with connectors.

According to the aforementioned embodiment, the housing structure of the printed circuit board (30) with the connector (40, 41, 42) includes the printed circuit board (30) on which the electronic component is implemented, the connector (40, 41, 42) implemented on the end portion of the printed circuit board (30), the connector (40, 41, 42) including the fitted portion (43, 44) fitted with the mating component which is the connection target; and the housing (1) accommodating the printed circuit board (30) and the connector (40, 41, 42). The housing (1) includes the first case (10) surrounding the printed circuit board (30) and the second case (20, 120, 220) covering the connector (40, 41, 42). The second case (20, 120, 220) includes the first surface portion (21, 51) arranged at the side where the fitted portion (43, 44) of the connector (40, 41, 42) is provided, and the at least one second surface portion (22, 52) which is nonparallel to the first surface portion (21, 51).

According to the aforementioned configuration, the housing (1) of the printed circuit board (30) with the connector (40, 41, 42) includes the first case (10) surrounding the printed circuit board (30) and the second case (20, 120, 220) covering the connector (40, 41, 42), and the second case (20, 120, 220) includes the first surface portion (21, 51) arranged at the side where the fitted portion (43, 44) of the connector (40, 41, 42) is provided, and the at least one second surface portion (22, 52) which is nonparallel to the first surface portion (21, 51). Accordingly, the second case (20, 120, 220) of the housing (1) may be formed to apply the connector (40, 41, 42). Meanwhile, because of not depending on the shape of the connector (40, 41, 42), the first case (10) may be minimized. Accordingly, the whole of the housing (1) of the printed circuit board (30) with the connector (40, 41, 42) may be minimized. In a case where the housing (1) of the printed circuit board (30) with the connector (40, 41, 42) has different shapes of connectors (40, 41, 42), the first case 10 may be commonly provided or standardized, and the second case 20 may be appropriately selected, the second case (20) applicable to plural kinds of connectors (40) having different shapes.

According to the aforementioned embodiment, one of the first surface portion (21, 51) and the at least one second surface portion (22, 52) of the second case (20, 120, 220) is opposed to the printed circuit board (30), and is arranged at a position away from the printed circuit board (30) relative to a surface of the first case (10), the surface which is arranged at a side where the one of the first surface portion (21, 51) and the at least one second surface portion (22, 52) of the second case (20, 120, 220) is provided relative to the printed circuit board (30) and which is opposed to the printed circuit board (30).

According to the aforementioned configuration, the surface portion of the second case (20, 120, 220) which is opposed to the printed circuit board (30) is away from the printed circuit board (30) relative to a surface of the first case (10), the surface which is arranged at the same side relative to the printed circuit board (30) and which is opposed to the printed circuit board (30). Accordingly, the distance between the first case (10) and the printed circuit board (30) may be decreased and the distance between the second case (20, 120, 220) and the printed circuit board (30) may be increased. As a result, the outer shape of the housing 1 of the printed circuit board 30 with the connector 40 may be reduced.

According to the aforementioned embodiment, the one of the first surface portion (21, 51) and the at least one second surface portion (22, 52) of the second case (20, 120, 220) serving as the surface of the second case (20, 120, 220) opposed to the printed circuit board (30) includes a flat surface portion (26, 56) which is in parallel to a surface of the printed circuit board (30) on which the electronic component is implemented, and an extending portion (27, 57) continuously provided from an end portion (26a, 56a) of the flat surface portion (26, 56), the end portion (26a, 56a) arranged close to the first case (10), the extending portion (27, 57) extending toward the printed circuit board (30).

According to the aforementioned configuration, the one of the first surface portion (21, 51) and the at least one second surface portion (22, 52) of the second case (20, 120, 220) serving as the surface of the second case (20, 120, 220) opposed to the printed circuit board (30) includes a flat surface portion (26, 56) which is in parallel to a surface of the printed circuit board (30) on which the electronic component is implemented, and an extending portion (27, 57) continuously provided from an end portion (26a, 56a) of the flat surface portion (26, 56), the end portion (26a, 56a) arranged close to the first case (10), the extending portion (27, 57) extending toward the printed circuit board (30). Accordingly, the end portion (12a) of the first case 10 and the end portion (26a) of the second surface portion 22 of the second case 20 may be easily positioned relative to each other, and may be easily come in contact with each other.

According to the aforementioned embodiment, the first case (10) includes the bottom plate portion (11) covering the lower surface (30A) of the printed circuit board (30), the side wall portion (13, 14) which is standingly provided from the bottom plate portion (11) to cover the side portion of the printed circuit board (30) other than the side of the printed circuit board (30) where the connector (40, 41, 42) is implemented, and the top plate portion (12) covering the part of an upper surface (30B) of the printed circuit board (30), the upper surface (30B) which is arranged at a side where the flat surface portion (26) is provided, the part of the upper surface (30B) where the connector (40, 41, 42) is inhibited from being arranged. The connector (40, 41, 42) is oriented such that the mating component is fitted in parallel to the printed circuit board (30) from the distal end side of the fitted portion (43, 44). The second case (20, 120) is configured such that the first surface portion (21) is formed with the opening (25) surrounding the fitted portion (43, 44), the flat surface portion (26) of the second surface portion (22) being oriented to be opposed to the printed circuit board (30) in a parallel manner while sandwiching the connector (40, 41, 42) therebetween, the extending portion (27) extending perpendicularly to the flat surface portion (26) toward the printed circuit board (30) and being in contact with an end portion (12a) of the top plate portion (12). One of the first case (10) and the second case (20, 120) includes the engaged portion (the engaged protrusion 16), the other of the first case (10) and the second case (20, 120) including the hook portion (23) engaging with the engaged portion (the engaged protrusion 16), the engaged portion (the engaged protrusion 16) and the hook portion (23) constituting the snap fit portion. The fitted portion (43, 44) extends outwardly from the first surface portion (21).

According to the aforementioned configuration, the first case (10) includes the bottom plate portion (11), the side wall portions (13, 14), and the top plate portion (12) to surround the printed circuit board (30) except for a part where the connector (40, 41, 42) is provided. The second case (20, 120) is configured such that the first surface portion (21) includes the opening (25) surrounding the fitted portion (43, 44) of the connector (40, 41, 42), the flat surface portion (26) of the second surface portion (22) is oriented to be opposed to the printed circuit board (30) in a parallel manner while sandwiching the connector (40, 41, 42) therebetween, the extending portion (27) extending perpendicularly to the flat surface portion (26) toward the printed circuit board (30) and being in contact with an end portion (12a) of the top plate portion (12). Accordingly, the second case (20, 120) may securely cover the connector (40, 41, 42), and the housing (1) may be easily configured by the assembling of the second case (20, 120) with the first case (10). In addition, because the first case (10) and the second case (20, 120) constitute the snap fit portion, the housing (1) may be easily configured by the assembling of the second case (20, 120) with the first case (10) using the snap fit portion. Because the fitted portion (43, 44) of the connector (40, 41, 42) extends outwardly from the first surface portion (21) of the second case (20, 120), the fitted portion (43, 44) of the connector (40, 41, 42) may be easily fitted to be connected to the mating component which is a connection target.

The principles, preferred embodiment and mode of operation of the present invention have been described in the foregoing specification. However, the invention which is intended to be protected is not to be construed as limited to the particular embodiments disclosed. Further, the embodiments described herein are to be regarded as illustrative rather than restrictive. Variations and changes may be made by others, and equivalents employed, without departing from the spirit of the present invention. Accordingly, it is expressly intended that all such variations, changes and equivalents which fall within the spirit and scope of the present invention as defined in the claims, be embraced thereby.

The invention claimed is:

1. A housing structure of a printed circuit board with a connector, comprising:
   the printed circuit board on which an electronic component is implemented;
   the connector implemented on an end portion of the printed circuit board, the connector including a fitted portion fitted with a mating component which is a connection target; and
   a housing accommodating the printed circuit board and the connector, wherein
   the housing includes a first case surrounding the printed circuit board and a second case covering the connector, and
   the second case includes a first surface portion arranged at a side where the fitted portion of the connector is provided, and at least one second surface portion which is nonparallel to the first surface portion,
   wherein one of the first surface portion and the at least one second surface portion of the second case:
     is opposed to the printed circuit board, and
     is arranged at a position away from the printed circuit board relative to a surface of the first case, the surface which is arranged at a side where the one of the first surface portion and the at least one second surface portion of the second case is provided relative to the printed circuit board and which is opposed to the printed circuit board;
   wherein the one of the first surface portion and the at least one second surface portion of the second case serving as the surface of the second case opposed to the printed circuit board includes:
     a flat surface portion which is in parallel to a surface of the printed circuit board on which the electronic component is implemented, and
     an extending portion continuously provided from an end portion of the flat surface portion, the end portion arranged close to the first case, the extending portion extending toward the printed circuit board; and
   wherein the first case includes:
     a bottom plate portion covering a lower surface of the printed circuit board,
     a side wall portion which is standingly provided from the bottom plate portion to cover a side portion of the printed circuit board other than a side of the printed circuit board where the connector is implemented, and
     a top plate portion covering a part of an upper surface of the printed circuit board, the upper surface which is arranged at a side where the flat surface portion is provided, the part of the upper surface where the connector is inhibited from being arranged, wherein the connector is oriented such that the mating component is fitted in parallel to the printed circuit board from a distal end side of the fitted portion,
   the second case is configured such that the first surface portion is formed with an opening surrounding the fitted portion, the flat surface portion of the second surface portion being oriented to be opposed to the printed circuit board in a parallel manner while sandwiching the connector therebetween, the extending portion extending perpendicularly to the flat surface portion toward the printed circuit board and being in contact with an end portion of the top plate portion, one of the first case and the second case includes an engaged portion, the other of the first case and the second case including a hook portion engaging with the engaged portion, the engaged portion and the hook portion constituting a snap fit portion, and the fitted portion extends outwardly from the first surface portion.

2. A housing structure of a printed circuit board with a connector, comprising:

the printed circuit board on which an electronic component is implemented;

the connector implemented on an end portion of the printed circuit board, the connector including a fitted portion fitted with a mating component which is a connection target; and a housing accommodating the printed circuit board and the connector, wherein the housing includes a first case surrounding the printed circuit board and a second case covering the connector, and the second case includes a first surface portion arranged at a side where the fitted portion of the connector is provided, and at least one second surface portion which is nonparallel to the first surface portion, wherein one of the first surface portion and the at least one second surface portion of the second case:

is opposed to the printed circuit board, and is arranged at a position away from the printed circuit board relative to a surface of the first case, the surface which is arranged at a side where the one of the first surface portion and the at least one second surface portion of the second case is provided relative to the printed circuit board and which is opposed to the printed circuit board;

wherein the one of the first surface portion and the at least one second surface portion of the second case serving as the surface of the second case opposed to the printed circuit board includes:

a flat surface portion which is in parallel to a surface of the printed circuit board on which the electronic component is implemented and has a portion arranged at a side of the first case, and an extending portion continuously provided from the portion of the flat surface portion, the extending portion extending toward the printed circuit board, wherein the first case includes:

a bottom plate portion covering a lower surface of the printed circuit board, a side wall portion which is standingly provided from the bottom plate portion to cover a side portion of the printed circuit board other than a side of the printed circuit board where the connector is implemented, and a top plate portion covering a part of an upper surface of the printed circuit board, the upper surface which is arranged at a side where the flat surface portion is provided, the part of the upper surface where the connector is inhibited from being arranged, wherein the connector is oriented such that the mating component is fitted in parallel to the printed circuit board from a distal end side of the fitted portion, the second case is configured such that the first surface portion is formed with an opening surrounding the fitted portion, the flat surface portion of the second surface portion being oriented to be opposed to the printed circuit board in a parallel manner while sandwiching the connector therebetween, the extending portion extending perpendicularly to the flat surface portion toward the printed circuit board and being in contact with an end portion of the top plate portion, one of the first case and the second case includes an engaged portion, the other of the first case and the second case including a hook portion engaging with the engaged portion, the engaged portion and the hook portion constituting a snap fit portion, and the fitted portion extends outwardly from the first surface portion.

* * * * *